United States Patent [19]
Chen

[11] Patent Number: 6,084,445
[45] Date of Patent: *Jul. 4, 2000

[54] POWER ON/RESET STRAP FOR A HIGH SPEED CIRCUIT

[75] Inventor: Chengwu Chen, Rancho Cordova, Calif.

[73] Assignee: Intel Corporation, Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/971,446

[22] Filed: Nov. 17, 1997

[51] Int. Cl.[7] .................................................. H03K 17/74

[52] U.S. Cl. ............................................. 327/143; 327/493

[58] Field of Search ............................ 326/118; 327/142, 327/143, 493, 536, 504, 583

[56] References Cited

U.S. PATENT DOCUMENTS

| | | | |
|---|---|---|---|
| 3,852,575 | 12/1974 | Daniels et al. | 235/92 T |
| 3,855,536 | 12/1974 | Neuner | 328/92 |
| 5,140,178 | 8/1992 | Yoshihara et al. | 307/272.3 |

*Primary Examiner*—Timothy P. Callahan
*Assistant Examiner*—Jeff Zweizig
*Attorney, Agent, or Firm*—Blakely, Sokoloff, Taylor & Zafman LLP

[57] ABSTRACT

An initialization strap is disclosed. The initialization strap includes an electronic device capable of receiving a control signal and of transmitting a first output signal in response thereto; a first diode capable of receiving the first output signal, the first diode being forward biased when the first output signal is received and being reverse biased otherwise; a first line over which the electronic device may transmit the first output signal to the first diode; and a first resistor capable of tying the line to a first predetermined voltage level.

36 Claims, 6 Drawing Sheets

6,084,445

POWER ON/RESET STRAP FOR A HIGH SPEED CIRCUIT

BACKGROUND OF THE INVENTION

1. Field of the Invention

This invention pertains to the initialization of electronic computer components and, more particularly, to a power on/reset strap for a high speed circuit.

2. Description of the Related Art

Computers typically include a number of integrated circuit devices, or computer chips, that may be operated in more than one configuration. The computer is designed to use the chips in only one particular configuration and so the chips must be "initialized" or "setup" whenever a user turns the computer on or resets the computer. A chip is usually initialized by providing certain electrical signals to the chip, the chip previously having been programmed to configure itself in response to these signals. The circuitry used to generate initialization signals is frequently referred to as the "initialization strap."

These initialization signals are external signals. The initializing external signals are frequently received by the chip on memory address bus lines, although other types of signal lines are sometimes used. The individual external signal lines are tied high or low using "resistor pull-ups" or "resistor pull-downs," respectively. When a signal line is tied high using a resistor pull-up, the chip reads the signal as a digital 1 during the initialization process. Similarly, when a signal line is tied low using a resistor pull-down, the chip reads the signal as a digital 0 during the initialization process. As used herein, the terms "high" and "low" will be used to refer to a signal representing a digital 1 or 0, respectively. Thus, the signal line is "strapped" high or low. The chip therefore receives the configuration signals as soon as power is provided whenever the computer is turned on or reset, and automatically configures itself.

However, this type of resistive loading on signal lines poses significant problems as operating frequencies increase. In fact, at operating frequencies of 66 MHz and higher, this resistive loading becomes a major concern and degrades system performance. Thus, there is a need for a new technique to provide initialization signals to individual chips when a computer is turned on or reset.

SUMMARY OF THE INVENTION

The invention in one embodiment is an initialization strap including an electronic device capable of receiving a control signal and of transmitting a first output signal in response thereto; a first diode capable of receiving the first output signal, the first diode being forward biased when the first output signal is received and being reverse biased otherwise; a first line over which the electronic device may transmit the first output signal to the first diode; and a first resistor capable of tying the line to a first predetermined voltage level.

BRIEF DESCRIPTION OF THE DRAWINGS

A more particular description of the invention briefly summarized above is set forth below by way of particular embodiments disclosed in the drawings of this specification and as described in connection therewith. The drawings nevertheless illustrate only typical, particular embodiments of the invention and are not to be considered limiting thereon as the invention may admit to other equally effective embodiments. In the drawings.

Figure 1A:
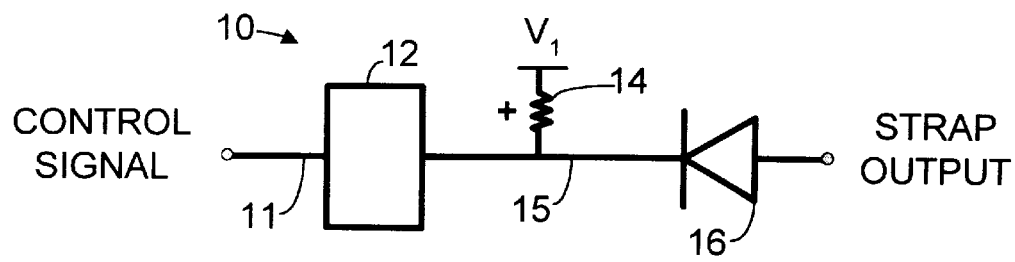
FIGS. 1A and 1B schematically illustrate two particular embodiments of the invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DESCRIPTION OF ILLUSTRATIVE EMBODIMENTS

Numerous specific details are set forth below in the detailed description of particular embodiments to provide a thorough understanding of the present invention. However, one of ordinary skill in the art having the benefit of this disclosure will understand that the present invention may be practiced without many of the details presented since such details will be necessary or useful depending on the particular embodiment being employed. Conversely, in other instances, well known details have not been described for the sake of clarity so as not to obscure the invention. It will be appreciated that supplying such details would be a routine undertaking for those of ordinary skill in the art, even if a complex and time-consuming task, given the benefit of this disclosure.

FIG. 1A schematically illustrates one embodiment of an initialization strap 10 constructed in accord with the invention. The strap 10 generally comprises an electronic device 12 receiving a control signal via the line 11 indicating that the system is being initialized. The electronic device 12 is preferably a memory device, but may also be a microcontroller, a logic gate, a field effect transistor ("FET"), or any other electronic device, depending on the particular embodiment implemented. In the particular embodiment illustrated in FIG. 1A, the electronic device 12 is a D flip-flop, a type of memory device. The electronic device 12 transmits an output signal to the input 15 of a diode 16. The diode 16 in the particular embodiment illustrated is typically reverse biased, and therefore nonconducting, until and unless it receives the output signal, whereupon it becomes forward biased and conducts. The input 15 is tied to a predetermined voltage level $V_1$ via the resistor 14 to prevent the input 15 from floating in the absence of an output signal and to reverse bias the diode 16 during normal operation.

In the embodiment of FIG. 1A, the orientation of the diode 16 indicates that the predetermined voltage $V_1$ must be high and that the output signal must transition low to indicate that a control signal indicating an initialization has been received. This particular embodiment therefore can be used when the active signal during normal operations is high and the output strap must be pulled low to initialize whatever system component might be connected thereto. Note that, during normal operations, the output signal on the input 15 of the diode 16 is high, the diode 16 does not conduct, and the strap 10 therefore does not load the system.

During normal operation, the control signal on the line 11 indicates that no initialization is occurring. In the embodiment illustrated, the electronic device 12 transmits a high output signal to the input 15 that reverse biases the diode 16. The diode 16 is then nonconducting and acts as an open circuit. When the control signal transitions to indicate initialization has begun, the output signal transitions low in response thereto to forward bias the diode 16. The diode 16 then conducts and pulls the strap low. When the control signal once again transitions to indicate resumption of normal operations, the output signal transitions high to once again reverse bias the diode 16.

Figure 1B:
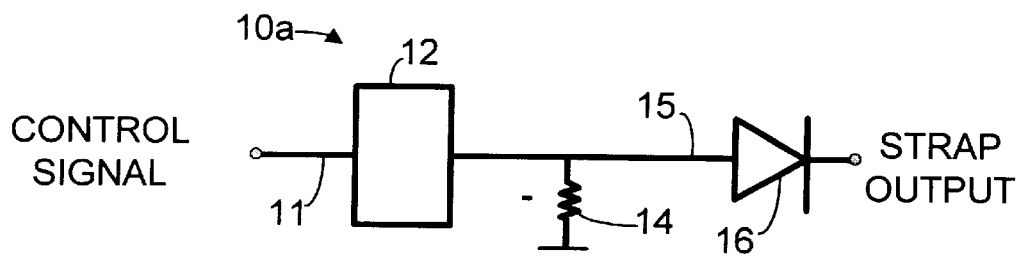

Also, as will be apparent to those in the art having the benefit of this disclosure, the strap 10 illustrated in FIG. 1A can readily be modified to pull a strap low during initialization by reversing the orientation of the diode 16, tying the input 15 low, and generating a low output signal in response to the control signal. The initialization strap 10a in the embodiment of FIG. 1B is one such variant and operates similarly to the strap 10 of the embodiment in FIG. 1A. Furthermore, a comparison of FIGS. 1A and 1B illustrates how specific implementations of various embodiments may affect the topology of the strap.

Figure 2:
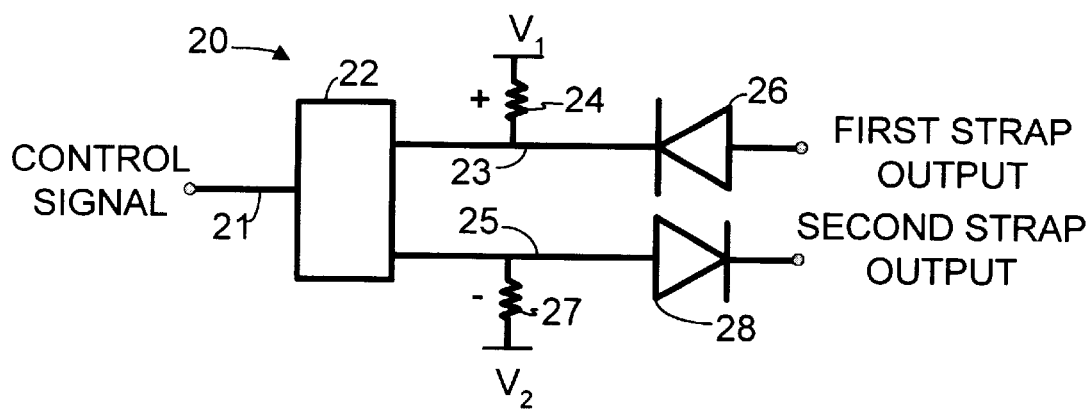
FIG. 2 schematically illustrates a third embodiment of the invention.

It is usually desirable to strap some signals high and others low during initialization. FIG. 2 illustrates one embodiment 20 of the invention that accomplishes this. The initialization strap 20 of FIG. 2 generally comprises a electronic device 22, a diode 26, and a diode 28. The diodes 26 and 28 are oriented in opposite directions relative to one another and the electronic device 22 transmits not only a first output signal via the line 23, but also a second output signal via the line 25. The second output signal is the complement of the first output signal in response to the control signal. Thus, the strap 20 can strap initialization signals high or low.

More particularly, in the embodiment illustrated, the electronic device 22 transmits a first output signal to the input 23 of the diode 26 and a second output signal to the input 25 of diode 28. The input 23 of the diode 26 is tied to the predetermined voltage level $V_1$ and the input 25 of the diode 28 is tied to the predetermined voltage level $V_2$, via the resistors 24 and 28, respectively, to prevent the inputs 23 and 25 from floating. The predetermined voltages $V_1$ and $V_2$ are complements, and thus one is high and the other low. Because of the orientation of diodes 26 and 28, the predetermined voltage level $V_1$ is high and the predetermined voltage level $V_2$ is low.

During normal operations, the electronic device 22 transmits a low output signal to the input 23 and a high output signal to the input 25. Thus, both the diode 26 and the diode 28 are reverse biased and nonconducting. When the control signal transitions to indicate initialization, the first output signal of the electronic device 22 on the input 23 transitions high and the second output signal of the electronic device 22 on the input 25 transitions low. The diodes 26 and 28 are then forward biased, conduct, and pull the first and second strap outputs high and low, respectively. When the control signal on the line 21 again transitions to indicate resumption of normal operation, the first output signal then transitions low and the second output signal transitions high. The diodes 26 and 28 are then once again reverse biased and nonconducting.

Figure 3A:
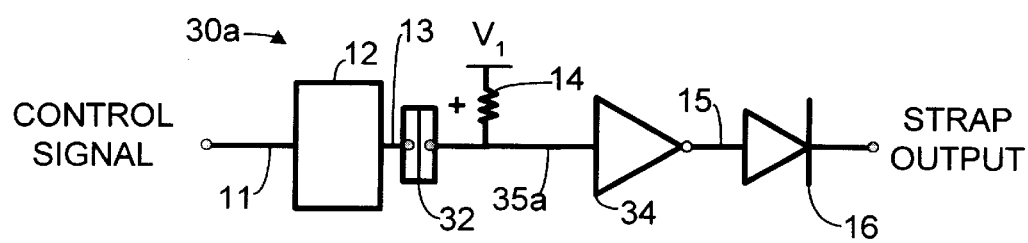
FIGS. 3A–3D schematically illustrate variations on the particular alternative embodiments of the invention illustrated in FIGS. 1A–1B.
Figure 3B:
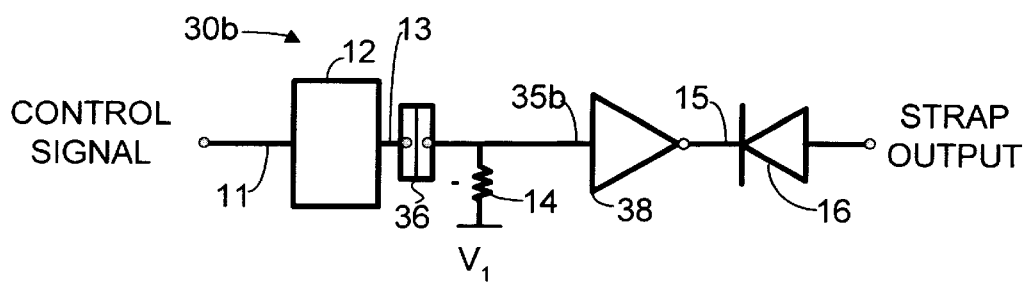
Figure 3C:
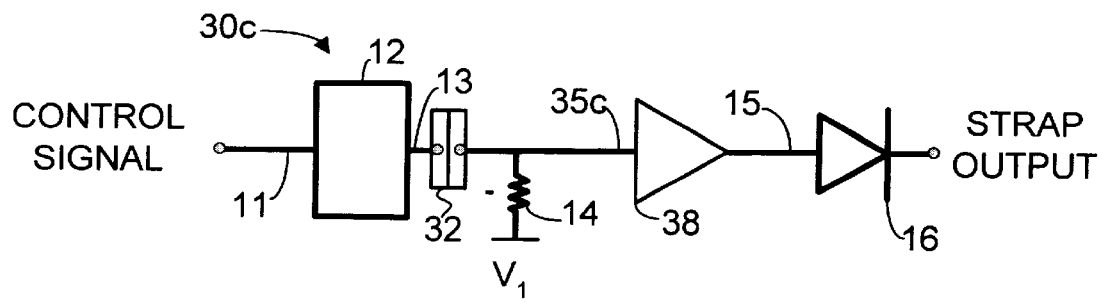
Figure 3D:
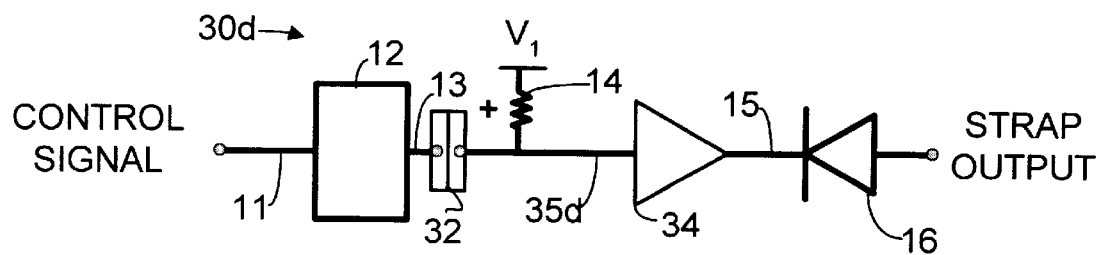

FIGS. 3A and 3B illustrate alternative particular embodiments 30a and 30b respectively, of an initialization strap constructed in accordance with the invention. The strap 30a generally comprises a electronic device 12, a connector 32, an inverting buffer 34, and a diode 16. More particularly, the electronic device 12 receives a control signal on line 11 and transmits in response thereto a first output signal on the line 13. The buffer 34 has an input 35a tied to a predetermined voltage level $V_1$ and transmits a second output signal on line 15. The buffer 34 in this embodiment is an inverter and shall hereafter be referred to as such although other embodiments, such as those of FIGS. 3C and 3D, may use other types of buffers or omit buffer 34 altogether along with corresponding changes in topology. The connector 32 in this particular embodiment selectively connects the buffer 34 to the electronic device 12 in a manner well known to the art. The connector 32 in this embodiment is a jumper, although other types of connectors may be used and connector 32 may be omitted altogether in some embodiments. The buffer 34 thus receives the first output signal from the line 13 via the tied input 35a when connected to the electronic device 12 via the jumper 32. A diode 16 receives the second output signal via the line 15. The diode 16 is forward biased and conducts when the second output signal is at a voltage higher than that of the strap output, including the predetermined voltage level $V_1$, and is reverse biased and nonconducting otherwise.

In the particular embodiment of FIG. 3A, the electronic device 12 transmits a low output signal on the line 13 in response to the control signal on the line 11. The input 35a is tied high via the pull-up resistor 14 to the predetermined voltage level $V_1$. The input to the inverter 34 consequently does not float when the inverter 34 does not receive an output signal from the electronic device 12. Thus, the signal on the input 35a is low when the inverter 34 is selectively connected to the electronic device 12, receives the first output signal, and the first output signal is low. The signal on the input 35a is otherwise high. The inverter 34 inverts the signal received on the input 35a and transmits the inverted signal on the line 15 to the diode 16. Because of the orientation of the diode 16, it is reverse biased and acts as an open circuit unless the inverted signal on the line 15 is high. When the signal on the line 15 is high, the diode 16 becomes forward biased and conducts, thereby the output strap high. Thus, to pull the output strap high, the first output signal on the line 13 must be low. Some embodiments may include a current limiting resistor on the line 15 between the inverter 34 and the diode 16.

The particular embodiment illustrated in FIG. 3A is therefore used to set an initialization signal high when the default is low. For instance, if a particular system was constructed so that all initialization signals default to low but a particular signal needed to be set high for some reason, the particular embodiment of FIG. 3A may be used. However, the embodiment may be readily modified for use in the converse circumstance where the default is high and a low initialization signal is desired. The modification may be achieved by reversing the orientation of the diode 16, tying the input 35a low, and employing a electronic device 12 that transmits a high first output signal in response to the control signal on the line 11. This modification is illustrated in the embodiment of FIG. 3B.

Figure 4:
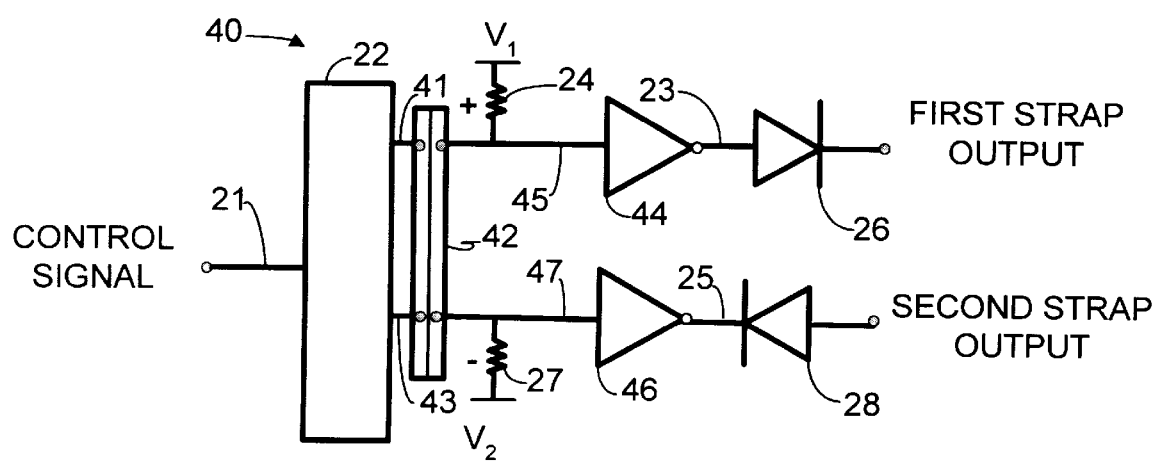
FIG. 4 schematically illustrates a variation on the particular embodiment of the invention illustrated in FIG. 2.

FIG. 4 illustrates a particular embodiment 40 of an initialization strap in accordance with the present invention that may be used to generate both high and low initialization signals. The particular embodiment of FIG. 4 generally comprises an electronic device 22, a jumper 42, a first inverter 44, and a first diode 26. More particularly, the electronic device 22 receives a control signal on the line 21 and transmits in response thereto a first output signal on the line 41. The first inverter 44 has its input 45 tied to the predetermined voltage level $V_1$ via the resistor 24 and transmits a second output signal on the line 23. The jumper 42 selectively connects the first inverter 44 to the electronic device 22 in a manner well known to the art. The first inverter 44 thus receives the first output signal from the line 41 via the tied input 45 when selectively connected to the electronic device 22 via the jumper 42. The first diode 26 receives the second output signal via the line 23. The diode 26 is forward biased when the second output signal is at a level higher than the first strap output, including the predetermined voltage level $V_1$, and reverse biased otherwise.

Additionally, however, the electronic device 22 transmits not only a first output signal on the line 41, but also a third output signal on the line 43, the third output signal being the complement of the first output signal on the line 41. A second inverter 46 has its input 47 tied to a second predetermined voltage level $V_2$ via the resistor 27, the second predetermined voltage level being the complement of the first predetermined voltage level. The second inverter 46 inverts the signal received on the input 47 and transmits it as a fourth output signal via the line 25. The jumper 42 selectively connects the second inverter 46 to the electronic device 22 in the same manner as for the first inverter 44. The second inverter 46 receives the third output signal from the line 43 via the tied input 47 and the jumper 42 when selectively connected to the electronic device 22. The second diode 28 receives the fourth output signal on the line 25. The second diode 28 is forward biased when the fourth output signal is received via line 25 and is reverse biased otherwise.

In the embodiment of FIG. 4, again because of the orientation of the diodes 26 and 28, the first and second predetermined voltage levels $V_1$ and $V_2$ are high and low, respectively. Thus, the first output signal on the line 41 generated in response to the control signal is low and the third output signal on the line 43, the complement of the first, is high. The input 45 is tied high via the resistor 14a and the input 47 is tied low via the resistor 14b so that the inputs to the inverters 44 and 46 do not float when they do not receive an output signal from the electronic device 22. Thus, the signal on the input 45 is low when the inverter 44 is selectively connected to the electronic device 22, receives the first output signal, and the first output signal is low. The signal on the input 47 is high when the inverter 46 is selectively connected to the electronic device 22, receives the third output signal, and the third output signal is high. The signals on the inputs 45 and 47 are otherwise high and low, respectively. The inverters 44 and 46 invert the signals received on the inputs 45 and 47, respectively, and transmits the inverted signals on the lines 23 and 25, respectively, to the diodes 26 and 28, respectively.

Because of the orientation of the diode 26, it is reverse biased and acts as an open circuit unless the inverted signal on the line 23 is high, in which case it pulls the first strap output high. Likewise, because of the orientation of the diode 28, it is reverse biased and acts as an open circuit unless the inverted signal on the line 25 is low, in which case it pulls the second strap output low. Thus, to pull the first output strap high, the first output signal on the line 41 must be low and to pull the second output strap low, the third output signal on the line 43 must be high. Some embodiments may include a current limiting resistor on the line 23 between the inverter 44 and the diode 26 and/or on the line 25 between the inverter 46 and the diode 28.

Figure 5:
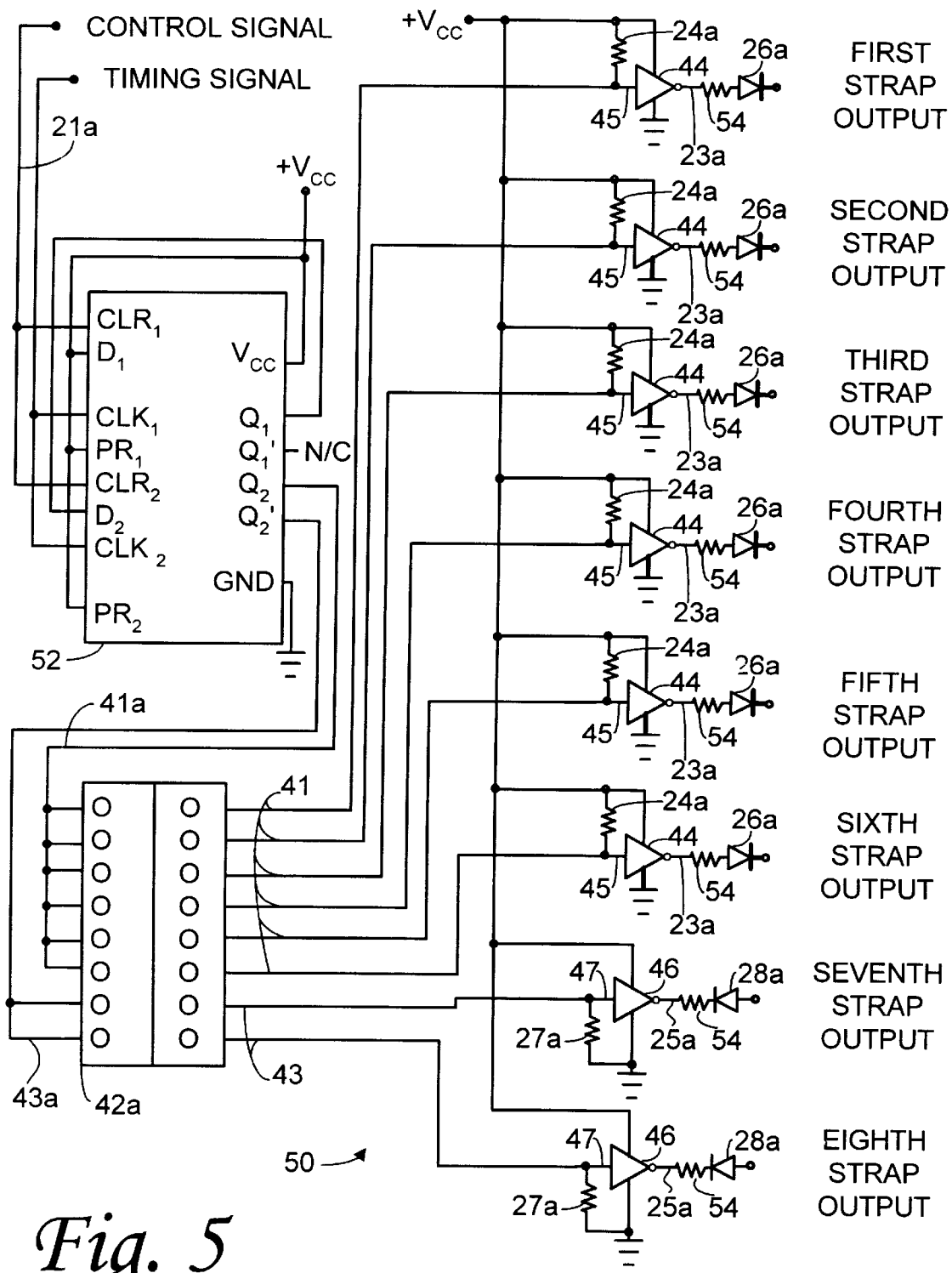
FIG. 5 diagrams another alternative embodiment of the invention extrapolated from the embodiment of FIG. 2.

FIG. 5 illustrates yet another particular embodiment 50 extrapolated from those described above. The particular embodiment of FIG. 5 generally comprises a memory device 52, a jumper 42a, a first inverter 44, a second inverter 46, a first diode 26a, and a second diode 28a. Note, however, that this particular embodiment includes six inverters 44, six diodes 26a, two inverters 46, and two diodes 28a. However, the particular number of inverters and diodes is not material to the practice of the invention.

More particularly, the memory device 52 is implemented with flip-flops. This particular embodiment employs a 74LVC74 dual D flip-flop integrated circuit package manufactured by, among others, Texas Instruments, and wired as shown. The flip-flops receive a control signal on the line 21a, which may be the peripheral component interconnect ("PCI") bus reset signal, and a timing signal, which may be the PCI bus clock, although other control and timing signals may be used. The control signal and the timing signal serve as the "clear" (CLR1, CLR2) and "clock" (CLK1, CLK2) inputs, respectively, to the flip-flops while the "preset" (PR1, PR2) inputs are tied high to the $+V_{cc}$. The "data" (D1) input to the first flip-flop is likewise tied high to $+V_{cc}$ while the Q (Q1) output of the first flip-flop is the "data (D2) input to the second flip-flop. The Q' (Q1') output of the first flip-flop is not used.

The second flip-flop transmits the first and third output signals on the lines 41a and 43a, respectively, in response to the control signal. As in the embodiment of FIG. 4, the third output signal is the complement of the first output signal. Note that the first output signal is the Q (Q2) output and that the third output signal is the Q' (Q2') output—thus, the third output signal is the complement of the first. The logic tables governing the operation of D flip-flops are well known in the art. However, in the embodiment of FIG. 5, the first output signal is low when the control signal is low and high when the control signal is high, after some delay based on the timing signal, and so the third output signal is high when the control signal is low and is low when the control signal is high, again after some delay based on the timing signal.

Each of the inverters 44 has its input 45 tied to the first predetermined voltage level $V_1$, which is $+V_{cc}$ in this particular embodiment, by a pull-up resistor 24a, which is a 10KΩ resistor. Each of the inverters 46 has its input 47 tied to the second predetermined voltage level $V_2$, which is ground in this particular embodiment, by a pull-down resistor 27a, which is also a 10KΩ resistor. The inverters 44 and the inverters 46 are available from one or more 74LVC04 integrated circuit packages made by, among others, Texas Instruments, and are well known in the art. The inverters 44 and 46 provide driving strength for the strap outputs. Each of the inverters 44 transmits a second output signal on a respective line 23a and each of the inverters 46 transmits a fourth output signal on a respective line 25a.

Still referring to FIG. 5, the jumper 42a selectively connects each of the inverters 44 and 46 to the memory device 52 in a manner well known to the art. The jumper is a wired connector whose input and output pins may be selectively shorted to provide the desired connections. The inverters 44 thus receive the first output signal from a respective line 41 via the respective tied inputs 45 when connected to the memory device 52 via the jumper 42a. The diodes 26a then receive the second output signal via a respective line 23a. The diodes 26a are forward biased when the second output signal is at the first predetermined voltage level (i.e., $V_{cc}$) and reverse biased otherwise.

Similarly, the inverters 46 receive the third output signal from a respective line 43 via the respective tied inputs 47 when selectively connected to the memory device 52 via the jumper 42a. The diodes 28a then each receive the fourth output signal via a respective line 25a. The diodes 28a are forward biased when the fourth output signal is at the predetermined voltage level $V_2$ (i.e., ground) and reverse biased otherwise. Each of the diodes 26a and 28a in the embodiment illustrated are 1N4148 diodes manufactured by, among others, Texas Instruments, and are known in the art, but other kinds of diodes may be employed. Note the presence of the current limiting resistors 54, each of which are 300 Ω resistors. The precise value of the resistors is not material to the practice of the invention so long as they perform the indicated function.

In normal operations, if the jumper 42a is connected, the control signal on the line 21a is high. Thus, the first output signal on the line 41a is high and the third output signal on the line 41 is high, and so the second output signal on the line 43a is low while the fourth output signal on the line 43 is low. This reverse biases each of the diodes 26a and the diodes 28a so that they behave as open circuits and do not apply any resistive load on the system. When the computer (not shown) is turned on or reset, the control signal transitions low and, the first output signal transitions low while the third output signal transitions low. The second output signal then transitions high and the fourth output signal transitions high. The diodes 26a and 28a are then forward biased and conduct the first through eighth strap outputs. The first through sixth strap outputs pull their respective lines high and the seventh through eighth strap outputs pull their respective lines low. Note that the operating characteristics of diodes are such that the resistive load of the first through eighth strap outputs is negligible.

Figure 6A:
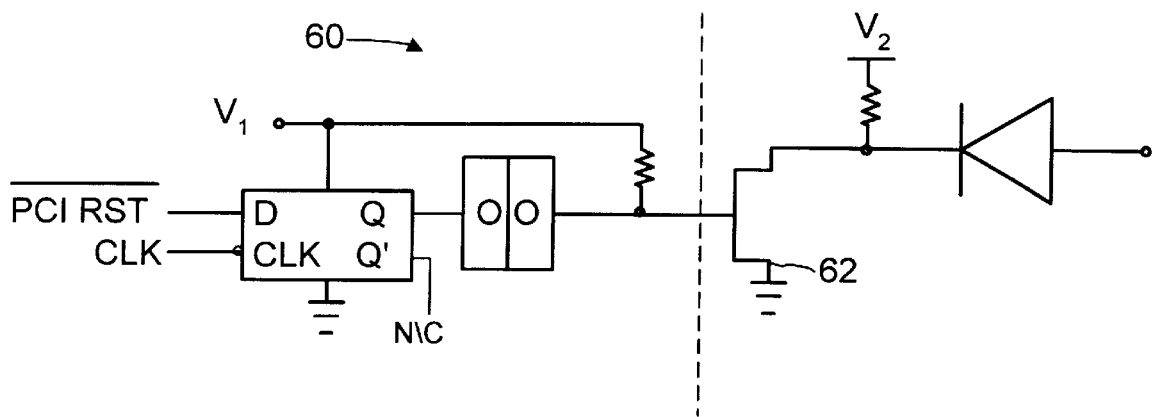
FIGS. 6A and 6B schematically illustrate additional particular embodiments of the invention.
Figure 6B:
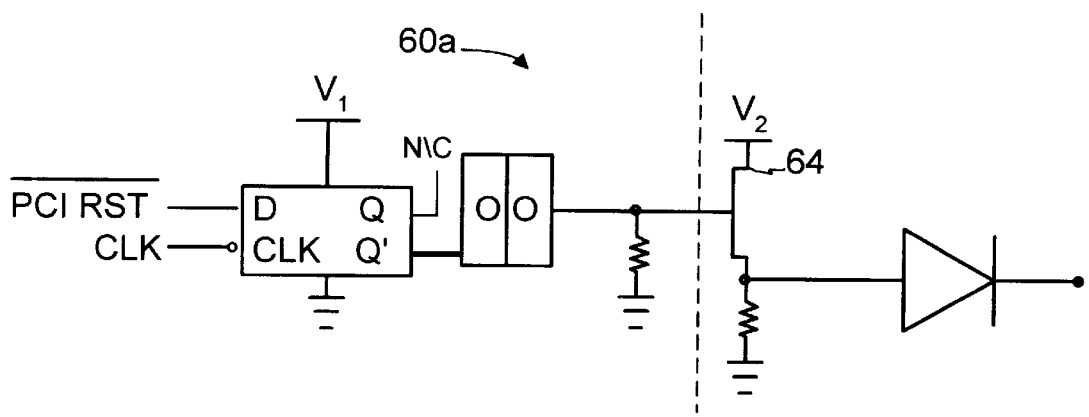

As those skilled in the art having the benefit of this disclosure will appreciate, the invention can be practiced in many variations. For instance, FIGS. 6A and 6B disclose two particular embodiments 60 and 60a, respectively, constructed in accord with the invention. Unlike the embodiments of FIGS. 1A–5, each of the straps 60 and 60a employs two different voltage planes to tie the straps 60 and 60a high and low, respectively. The two voltage planes in each of the embodiments 60 and 60a transition at a field effect transistor ("FET") 62 and 64, respectively, which in the embodiments illustrated are a p-channel FET and an n-channel FET, respectively. Both $V_1$ and $V_2$ are high voltages in the embodiments 60 and 60a. The straps 60 and 60a otherwise operate in a manner analogous to the embodiments of FIGS. 1A–5. Note that, in the embodiments illustrated, the control signal is the complement of the PCI reset signal.

The present invention in the various embodiments disclosed above provides numerous advantages relative to the conventional resistive loading techniques discussed above. Not only does it provide the same function as the conventional resistive loading techniques during initialization, but it does so in a way suitable for use in computers operating at frequencies of 66 MHz and higher. It also has numerous advantages during normal operation, including facilitating signal integrity, reducing system-wide resistive loading, and reducing leakage current.

Thus, the present invention in the various embodiments disclosed above is well suited to meet the need for a new technique for providing initialization signals to chips when the computer is turned on or reset. The invention may be implemented in many ways and is consequently useful for a variety of applications for reset straps. Further, the invention greatly reduces the high frequency stud connection problems.

The particular embodiments disclosed above are therefore illustrative only as the invention may be modified and practiced in different but equivalent manners apparent to those skilled in the art having the benefit of the teachings herein. For instance, the embodiments of FIGS. 3A–5 employ inverters as buffers. However, other types of buffers may be used in other embodiments, or even omitted altogether as in the embodiments of FIGS. 1 and 2. Likewise, connectors other than jumpers may be used and, in some embodiments, jumpers may be omitted entirely. Still further, although the embodiment of FIG. 5 employs a flip-flop, a variety of memory or logic devices may instead be employed. Finally, as is evident from the various embodiments discussed above, the topology of a given implementation will depend greatly on whether the strap output is tied high or low and on what type of components are used in the embodiment.

Thus, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. An initialization strap, comprising:
   an electronic device for receiving a control signal and initiating a reset signal to reset computer circuitry to an initial condition;
   a diode coupled to the electronic device for receiving the reset signal, the diode being forward biased when the reset signal is received and being reverse biased otherwise; and
   a resistor coupled between a voltage level and a junction of the electronic device and the diode, which maintains the diode in reverse bias until the reset signal is received, the diode preventing resistive loading on the computer circuitry until reset is initiated.

2. The initialization strap of claim 1, further comprising a buffer, coupled between the junction of the electronic device to the resistor and the diode, for buffering the reset signal.

3. The initialization strap of claim 2, wherein the buffer is an inverter.

4. The initialization strap of claim 2, further comprising a jumper for selectively coupling the buffer to the electronic device.

5. The initialization strap of claim 1, further comprising a jumper for selectively coupling the diode to the electronic device.

6. The initialization strap of claim 5, wherein the jumper is a wired connector.

7. An initialization strap, comprising:
   a flip-flop for initiating a reset signal to reset a circuit in response to a received control signal;
   a diode coupled to the flip-flop for receiving the reset signal, the diode being forward biased when the reset signal is received and being reverse biased otherwise; and
   a resistive device coupled between a voltage level and a junction of the flip-flop and the diode, which maintains the diode in reverse bias until the reset signal is received, the diode preventing resistive loading on the circuit until reset is initiated.

8. An initialization strap, comprising:
   an electronic device for receiving a control signal and transmitting a first and a second output signals in response thereto, the second output signal being a complement of the first output signal;

a first diode for receiving the first output signal, the first diode being forward biased when the first output signal is received and being reverse biased otherwise;

a first line over which the electronic device transmits the first output signal to the first diode; and a first resistor coupling the first line to a first predetermined voltage level.

9. The initialization strap of claim 8, further comprising:

a second diode for receiving the second output signal, the second diode being forward biased when the second output signal is received and being reverse biased otherwise;

a second line over which the electronic device transmits the second output signal to the second diode; and a second resistor coupling the second line to a second predetermined voltage level, the second predetermined voltage level being different from the first predetermined voltage level.

10. An initialization strap, comprising:

an electronic device for receiving a control signal and initiating a first reset signal in response thereto to reset computer circuitry to an initial condition;

a first diode for receiving the first reset signal, the first diode being forward biased when the first reset signal is received and being reverse biased otherwise; and a first resistor coupled between a voltage level and a junction of the electronic device and the first diode, which maintains the first diode in reverse bias until the reset signal is received, the diode preventing resistive loading on the computer circuitry until reset is initiated.

11. The initialization strap of claim 10, further comprising a first buffer, coupled between the junction of the electronic device to the first resistor and the first diode, for buffering the reset signal.

12. The initialization strap of claim 11, wherein the first buffer is an inverter.

13. The initialization strap of claim 11, further comprising a jumper selectively coupling the first buffer to the electronic device.

14. The initialization strap of claim 10, further comprising a jumper selectively coupling the first diode to the electronic device.

15. The initialization strap of claim 14, wherein the jumper is a wired connector.

16. An initialization strap, comprising:

an electronic device for receiving a control signal and transmitting a first and a second output signals in response thereto, the second output signal being a complement of the first output signal;

a first diode for receiving the first output signal, the first diode being forward biased when the first output signal is received and being reverse biased otherwise;

a first line over which the electronic device transmits the first output signal to the first diode; and a first resistor coupling the first line to a first predetermined voltage level.

17. The initialization strap of claim 16, further comprising:

a second diode for receiving the second output signal, the second diode being forward biased when the second output signal is received and being reverse biased otherwise;

a second line over which the electronic device transmits the second output signal to the second diode; and a second resistor coupling the second line to a second predetermined voltage level, the second predetermined voltage level being different from the first predetermined voltage level.

18. An initialization strap, comprising:

an electronic device for receiving a control signal and transmitting a first output signal and a second output signal that is a complement of the first output signal in response thereto the first and second output signals resetting computer circuitry to an initial condition;

a first diode receiving the first output signal, the first diode being forward biased when the first output signal is received and being reverse biased otherwise;

a first line over which the electronic device transmits the first output signal to the first diode;

a first resistor coupling the first line to a first predetermined voltage level;

a second diode receiving the second output signal, the second diode being forward biased when the second output signal is received and being reverse biased otherwise;

a second line over which the electronic device transmits the second output signal to the second diode; and a second resistor coupling the second line to a second predetermined voltage level, the second predetermined voltage level being different from the first predetermined voltage level.

19. The initialization strap of claim 18, further comprising a buffer on at least one of the first line between the first resistor and the first diode and the second line between the second resistor and the second diode, the buffer receiving, buffering, and transmitting the corresponding one of the first an second output signals to the corresponding one of the first and second diodes.

20. The initialization strap of 19, wherein the buffer is an inverter.

21. The initialization strap of claim 19, further comprising a jumper for selectively coupling the buffer to the electronic device at a point between the corresponding one of the first and second resistors and the electronic device.

22. The initialization strap of claim 18, further comprising a jumper for selectively coupling at least one of the first diode and the second diode to the electronic device at a point between the corresponding one of the first and second resistors and the electronic device.

23. The strap of claim 18, wherein the jumper is a wired connector.

24. The initialization strap of claim 18, wherein the electronic device is a flip-flop.

25. An initialization strap, comprising:

an electronic device for receiving a control signal and transmitting in response thereto a first output signal and a second output signal, the second output signal being the complement of the first output signal, the first and second output signals resetting computer circuitry to an initial condition;

a first inverter having an input coupled to a first predetermined voltage level through a pull-up resistor and transmitting a third output signal;

a second inverter having an input coupled to a second predetermined voltage level through a pull-down resistor, the second predetermined voltage being different from the first predetermined voltage, and transmitting a fourth output signal;

a jumper selectively coupling the first inverter and the second inverter to the electronic device, the first and second inverters receiving the first and second output signals, respectively;

a first diode receiving the third output signal, the first diode being forward biased when the third output signal is at the first predetermined voltage level and reverse biased otherwise; and a second diode receiving the fourth output signal, the second diode being forward biased when the fourth output signal is at the second predetermined voltage level and reverse biased otherwise.

26. The initialization strap of claim 25, wherein the electronic device is a flip-flop.

27. The initialization strap of claim 25, wherein the jumper is a wired connector.

28. An initialization strap, comprising;

means for receiving a control signal and for initiating a reset signal to reset a computer circuit to an initial condition;

a diode coupled to the means for initiating the reset signal to receive the reset signal, the diode being forward biased when the reset signal is received and being reverse biased otherwise; and a resistive means coupled between a voltage level and a junction of the electronic device and the diode, which maintains the diode in reverse bias until the reset signal is received, the diode preventing resistive loading on the circuit until reset is initiated.

29. The initialization strap of claim 28, further comprising means for buffering the reset signal.

30. The initialization strap of claim 29, wherein the means for buffering is an inverter.

31. The initialization strap of 28, further comprising means for selectively coupling the diode to the means for initiating the reset signal.

32. The initialization strap of claim 31, wherein the means for selectively coupling is a wired connector.

33. The initialization strap of claim 28, wherein the means for initiating is an electronic device.

34. An initialization strap, comprising:

means for receiving a control signal and for transmitting a first and a second output signals in response thereto, the second output signal being a complement of the first output signal, the first and second output signals resetting computer circuitry to an initial condition;

a first diode receiving the first output signal, the first diode being forward biased when the first output signal is received and being reverse biased otherwise;

a first line over which the means for receiving and transmitting transmits the first output signal to the first diode; and a first resistor coupling the first line to a first predetermined voltage level.

35. The initialization strap of claim 34, further comprising:

a second diode receiving the second output signal, the second diode being forward biased when the second output signal is received and being reverse biased otherwise;

a second line over which the means for receiving and transmitting transmits the second output signal to the second diode; and a second resistor coupling the second line to a second predetermined voltage level, the second predetermined voltage level being different from the first predetermined voltage level.

36. An initialization strap, comprising:

a flip-flop receiving a reset signal and transmitting in response thereto a first output signal and a second output signal, the second output signal being the complement of the first output signal, the first and second output signals resetting computer circuitry to an initial condition;

a first inverter having an input coupled to a first predetermined voltage level through a pull-up resistor and transmitting a third output signal;

a second inverter having an input coupled to a second predetermined voltage level through a pull-down resistor and transmitting a fourth output signal;

a wired connector selectively coupling the first inverter and the second inverter to an electronic device, the first and second inverters receiving the first and second output signals, respectively, via the respective coupled inputs when coupled to the electronic device;

a first diode receiving the third output signal, the first diode being forward biased when the third output signal is at the first predetermined voltage level and reverse biased otherwise; and a second diode receiving the fourth output signal, the second diode being forward biased when the fourth output signal is at the second predetermined voltage level and reverse biased otherwise.

* * * * *